United States Patent
Veenstra et al.

(10) Patent No.: US 6,532,123 B1
(45) Date of Patent: Mar. 11, 2003

(54) WRITE DRIVE APPARATUS

(75) Inventors: Hugo Veenstra, Eindhoven (NL); Luan Le, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 416 days.

(21) Appl. No.: 09/598,722

(22) Filed: Jun. 21, 2000

(30) Foreign Application Priority Data

Jun. 22, 1999 (EP) ............................................. 99401547

(51) Int. Cl.[7] ................................................. G11B 5/09
(52) U.S. Cl. .......................................... 360/46; 360/68
(58) Field of Search ............................. 360/46, 68, 53, 360/67; 327/108, 110, 494

(56) References Cited

U.S. PATENT DOCUMENTS

| | | | | |
|---|---|---|---|---|
| 5,612,828 A | * | 3/1997 | Brannon et al. | 360/46 |
| 5,668,676 A | | 9/1997 | Voorman et al. | |
| 6,215,607 B1 | * | 4/2001 | Ngo | 360/46 |
| 6,246,269 B1 | * | 6/2001 | Schuler et al. | 360/46 |

* cited by examiner

Primary Examiner—Alan T. Faber
(74) Attorney, Agent, or Firm—Steven R. Biren

(57) ABSTRACT

The invention provides a write driver circuit for writing an information signal on a magnetic record carrier. The write driver circuit comprises a first and a second input terminal (20,22) for receiving the information signal. A first current sink (24) is available, having a first transistor (T3) of a first type, having a first main electrode coupled to the first point of constant potential (+), having a second main electrode coupled to the first input (34) of a write head combination (32) via a first impedance (38), and a control electrode coupled to the first input terminal (20). A second current sink (28) is available having a second transistor (T4) of the first type, having a first main electrode coupled to the first point of constant potential (+), having a second main electrode coupled to the second input (36) of the write head combination via a second impedance (42), and a control electrode coupled to the second input terminal (22). A first current source (26) is available having a third transistor (T1) of the first type, having a first main electrode coupled to the first input (34) of the write head combination, having a second main electrode coupled to a second point of constant potential (−), and a control electrode coupled to the first input terminal (20). Further, a second current source (30) is available having a fourth transistor (T2) of the first type, having a first main electrode coupled to the second input (36) of the write head combination, having a second main electrode coupled to the second point of constant potential (−), and a control electrode coupled to the second input terminal (22).

11 Claims, 4 Drawing Sheets

WRITE DRIVE APPARATUS

BACKGROUND OF THE INVENTION

The invention relates to a write driver apparatus for writing an information signal on a magnetic record carrier and hard disk drive provided with the write driver apparatus. A write driver apparatus as defined above known from U.S. Pat. No. 5,668,676.

The write driver apparatus is meant for incorporation in a hard disk drive (HDD). The known write driver apparatus has the disadvantage that it does not function properly for very high datarates.

SUMMARY OF THE INVENTION

The invention aims at providing an improved write driver circuit which is capable of recording data with higher datarates than now possible with known driver apparatuses.

The write driver circuit in accordance with the invention comprises
- a first and a second input terminal (20,22) for receiving the information signal,
- a first point of a first constant potential (+),
- a second point of a second constant potential (−),
- a write head combination (32) having a first and a second input (34,36),
- a first current sink having a first transistor (T3) of a first type, having a first main electrode coupled to the first point of constant potential, having a second main electrode coupled to the first input (34) of the write head combination via a first impedance (38), and a control electrode coupled to the first input terminal (20),
- a second current sink having a second transistor (T4) of the first type, having a first main electrode coupled to the first point of constant potential, having a second main electrode coupled to the second input (36) of the write head combination via a second impedance (42), and a control electrode coupled to the second input terminal (22),
- a first current source having a third transistor (T1) of the first type, having a first main electrode coupled to the first input (34) of the write head combination, having a second main electrode coupled to the second point of constant potential, and a control electrode coupled to the first input terminal (20),
- a second current source having a fourth transistor (T2) of the first type, having a first main electrode coupled to the second input of the write head combination, having a second main electrode coupled to the second point of constant potential, and a control electrode coupled to the second input terminal (22).

The invention is based on the recognition that the high parasitic output capacitance, as result of the output transistors having their collectors coupled to the output of the write driver circuits, impede the use of known write driver circuits for recording information at higher data rates. By adopting a circuit in which the output transistors are all of the same type, the parasitic output capacitance is reduced, so that recording at higher data rates becomes possible.

Preferably, with an information signal of a first polarity supplied to the to first and second input terminals (20,22), the first current source is adapted to generate a first current of predetermined amplitude (1+x).I, the first current sink is adapted to sink a second current of amplitude substantially equal to x.I, where x is a constant smaller than 1, and the second current sink is adapted to sink a third current of amplitude substantially equal to I via the write head combination (32), and wherein with an information signal of a second polarity, opposite said first polarity, supplied to the first and second input terminals (20,22), the second current source is adapted to generate a current substantially equal to (1+x).I, the second current sink is adapted to sink a current of amplitude substantially equal to x.I, and the first current sink is adapted to sink a current of amplitude substantially equal to I via the write head combination (32). The write driver apparatus in accordance with the invention enables the output impedance of the write driver circuit to be adapted to the impedance of the write head combination, which actually comprises a write head and an electrical interconnection of up to a few cm long, so that an optimal driving of the write head can be obtained. The invention makes it possible to use NPN transistors only in the output circuit of the write driver circuit, which enables the accommodation of the circuit in a smaller IC, because it requires a smaller chip surface. Further, when adopting the measure of claim 8, a more symmetric driving of the write head combination can be obtained.

BRIEF DESCRIPTION OF THE DRAWING

These and other aspects of the invention will become apparent in the following figure description, in which.

DESCRIPTION OF THE PREFERRED EMBODIMENT

Present day hard disk drives comprise a write driver circuit for driving a magneto-resistive write head that is located on the suspension portion of an actuator. The preferred location for the write driver circuit is on the base portion of the actuator, with preferably all circuits in one IC. This requires accurate models for the electrical interconnection between the write driver circuit and the head, which interconnection can be eg. 5 cm long and is located on a flexible base.

It can be shown that the electrical interconnection can be modelled into a lumped parameter system, using a frequency dependent series resistance and a frequency dependent series inductance. The parallel capacitance behaves independently of frequency.

Figure 1:
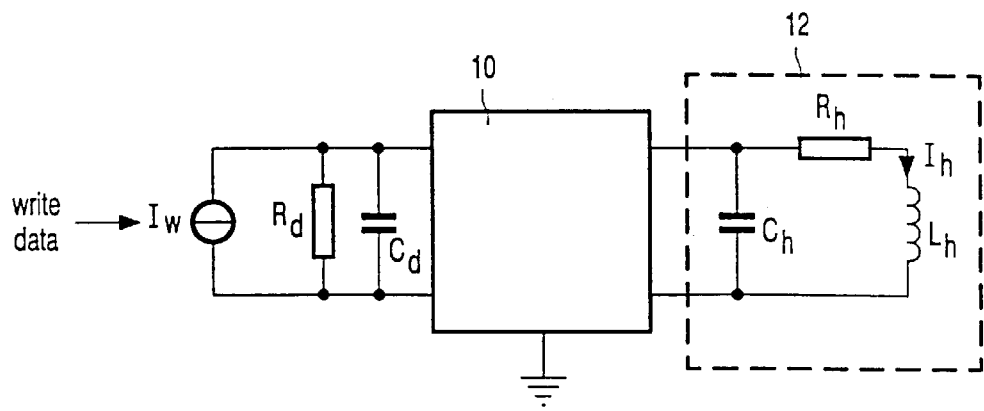
FIG. 1 shows an electrical model of the write driver, the electrical connection and the write head.

FIG. 1 shows schematically the electrical circuit diagram of the write driver circuit, the electrical interconnection and the head.

We consider a current source $I_w$ as write driver, coupled via the flexible interconnection 10 to the head 12. The interconnection is chosen such that its characteristic impedance $Z_0$ is in the range of 30–300 Ohm. The head 12 is considered to be a resonance circuit. The value for $L_h$ is the expected head inductance for a head capable of writing information with a bitrate of 700 Mb/s. The head series resistance $R_h$ has little effect on the head current. The head capacitance $C_h$ is chosen such that the head is critically damped, near to the characteristic impedance of the interconnection.

In this construction,
- the current source will see an interconnection that is terminated not characteristically. During the delay time $\Delta t$ of the interconnection, however, the write driver circuit does not 'see' the load impedance at the other side of the interconnection. At the input side of the interconnection, a voltage equal to $I.R_d$ occurs. This voltage arrives at the head side after $\Delta t$.
- reflections at the head side of the interconnection occur after a delay $\Delta t$;
- the reflected voltage subsequently appears at the input of the interconnection, after a delay of $2*\Delta t$.

Since the input side of the interconnection is terminated characteristically, no new reflections take place.

Figure 2:
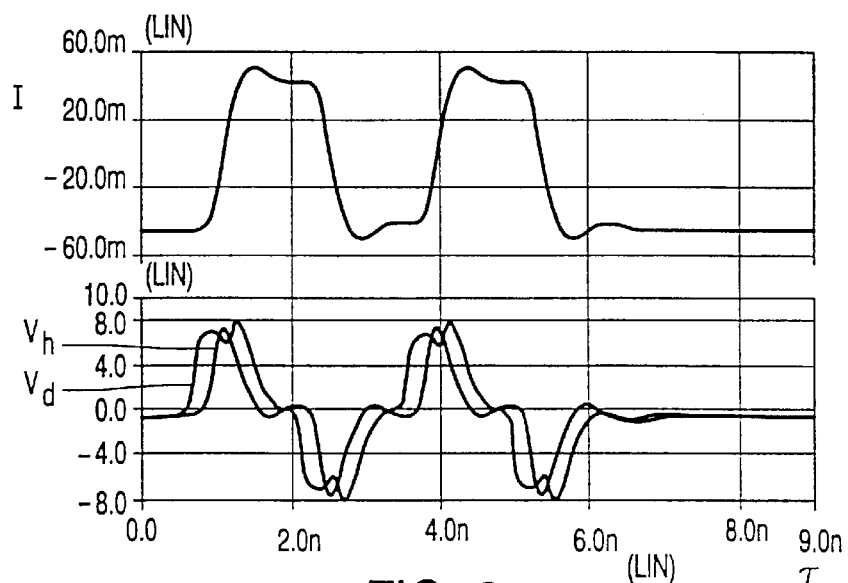
FIG. 2 shows some electrical diagrams of signals in the model of FIG. 1.
Figure 3:
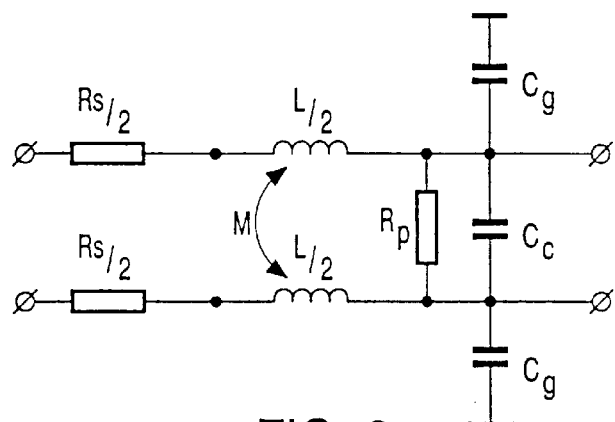
FIG. 3 shows a section for a lumped LC transmission line with common mode characteristic impedance $Z_{ocm} < \infty$ and delay $t_{cm} > 0$.

Simulations have been carried out on this system. The results of those simulations are shown in FIG. 2. The top diagram in FIG. 2 shows the write driver current I, applied to the head via the interconnection and the two curves in the bottom diagram in FIG. 2 show the input voltage across the input of the interconnection ($V_d$) and the head ($V_h$). The reflected waveform occurring after $2*\Delta t$ at the input of the interconnection is clearly visible. This shows the feasibility of driving this head via a 50 mm electrical interconnection. In this case, the head has been damped and driven via the electrical interconnection. The resulting head current has a risetime of only 0.373 ns compared to the 0.365 ns of the head when driven directly, without the interconnection. Some increased over- and undershoot occurs. This is due to the damping via the interconnection. The interconnection has been modelled including its losses $R_s$ and $R_p$, and its mutual inductance M, see FIG. 3.

So, by terminating the electrical interconnection with its characteristic impedance at the driver side, the interconnection can be seen as an almost ideal delay line.

The design procedure for the write driver circuit is first, to determine the optimum $R_d$ for the write head only with respect to rise/fall time and setting time, then to design the interconnection with $R_o = R_d$, and to implement the write driver circuit with output resistance $R_d$ and very low output capacitance $C_d$. This low output capacitance is important for the impedance matching. Simulations show that one can allow $C_d$ up to 1 pF for a specific write head. For higher $C_d$ values, reflections become visible. For a different write head, the maximum allowable driver output capacitance can be different.

So far, differential excitations in combination with differential termination of the electrical interconnection have been considered. Common mode effects have not been considered, yet. Any practical interconnection will have a finite common mode characteristic impedance, $Z_{ocm}$. Today, one sees not only differential impedance but also so called '3-transmission line' type of models, where pieces of the interconnection are each represented by a parallel connection of 3 transmission lines.

It should, however, be noted that in the '3-transmission line' model, common mode and differential mode behaviour are not fully separated. This is not a problem if the delays of common mode and differential mode signals are equal, but will produce wrong results when these delays are different.

It seems therefore more logical to generate a model where
- only one line is used, instead of 3 lines;
- each section of the line has the correct common mode and differential mode behaviour.

This can be done by fully separating common mode signal from differential mode signals.

In general, it can be said that the following requirements should be met:
- The interconnection model should be symmetrical with respect to input/output.
- If the interconnection is terminated with its characteristic impedance at one side, the interconnection can be seen as an almost ideal delay line. From the side that is terminated with its characteristic impedance, no reflections occur.
- The output impedance of the driver should be close to the characteristic impedance of the interconnection, to avoid reflections at the driver side. While doing so, the write head will see as damping impedance Zo. The output capacitance of the write driver should be low, to guarantee correct termination of the interconnection up to high frequencies.
- The characteristic impedance of the interconnection might provide a strong damping to the head. To reduce the rise time of the head current, a boost can be applied to the driver output current. Such boost can be realized by adding capacitors $C_n$, see FIG. 5, to be described later, or by applying an overshoot in the input current for the current sources 40, 42, 44 and 46.
- There is a significant difference between the rise time into the head versus into the interconnection, and consequently the rise time into the head can not accurately be measured at the input of the interconnection.
- To minimise interference from common mode excitations to the differential write current, the write driver should provide a symmetrical termination of the interconnection.

These conclusions are valid, independent of the write head model.

Figure 4:
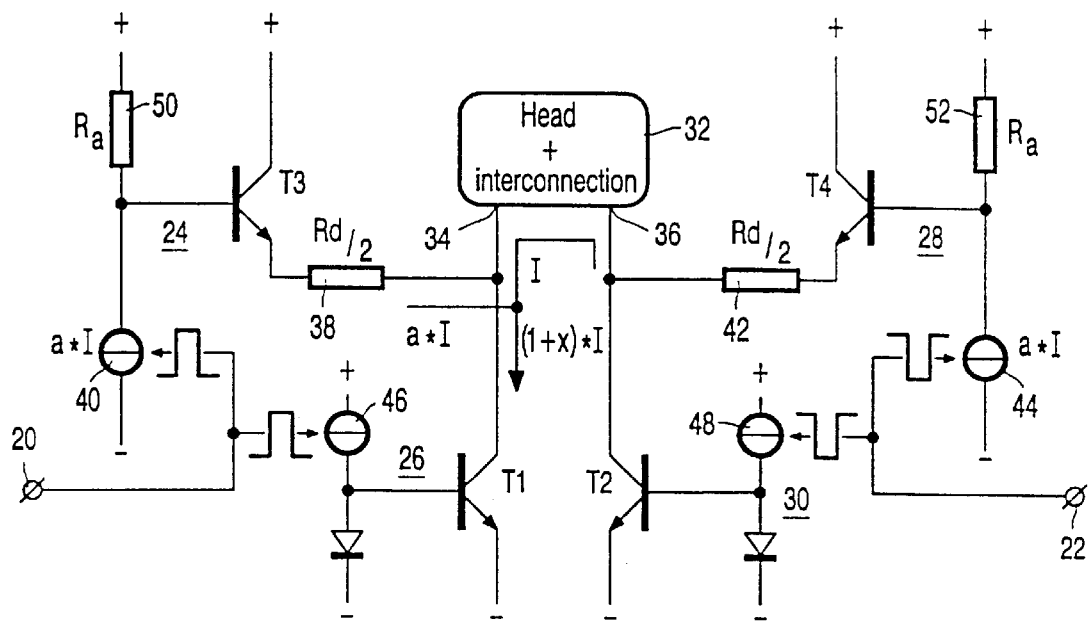
FIG. 4 shows an all-NPN write driver with reduced output capacitance.

Next, an all-npn (voltage/current) write driver circuit will be described with reference to FIG. 4. The write driver circuit of FIG. 4 comprises a first and a second input terminal 20 and 22, respectively, for receiving the information signal. The information signal is recorded such that, when a signal of positive polarity is supplied to the terminal 20, a signal of negative polarity is supplied to the terminal 22, and vice verse. A write head combination 32 is present having a first and a second input 34 and 36, respectively. The terminal 20 is coupled to inputs of a first current sink 24 and a first current source 26. The terminal 22 is coupled to a second current sink 28 and a second current source 30. The first current sink 24 comprises a first transistor T3 of a first type, more specifically the NPN type, having a first main electrode (its collector) coupled to a first point of constant potential (+) and having a second main electrode (its emitter) coupled to the first input 34 of the write head combination 32 via a first impedance 38, and a control electrode (its base) coupled to the first input terminal 20 via a current source 40. The second current sink 28 comprises a second transistor T4 of the first type, more specifically the NPN type, having a first main electrode (its collector) coupled to the first point of constant potential (+), having a second main electrode (its emitter) coupled to the second input 36 of the write head combination 32 via a second impedance 42, and a control electrode (its base) coupled to the second input terminal 22, via a current source 44. The first current source 26 comprises a third transistor T1 of the first type, more specifically the NPN type, having a first main electrode (its collector) coupled to the first input 34 of the write head combination 32, having a second main electrode (its emitter) coupled to the second point of constant potential (−), and a control electrode (its base) coupled to the first input terminal 20, via a current source 46. The second current source 30 comprises a fourth transistor T2 of the first type, more specifically the NPN type, having a first main electrode (its collector) coupled to the second input 36 of the write head combination 32, having a second main electrode (its emitter) coupled to the second point of constant potential (−), and a control electrode (its base) coupled to the second input terminal 22, via a current source 48. Further impedances 50 and 52 are present coupled between the bases of the transistors T3 and T4, respectively, and the first point of constant potential (+).

In this circuit construction, the transistors T3 and T4 are never 'off'. Current sources 26 and 30 provide a current (1+x)*I for a desired write current I. So far, simulations have been done with x≅0.1. Resistors $R_a$ and $R_d$ need to be of the same type.

As a first approximation, the head is damped with $R_d + R_o$ (T3)+$R_o$(T4). For a write current I=50 mA and x=0.1, the head is damped with $R_d$+6 Ohm. For a write current of 20 mA, the head is damped with $R_d$+15 Ohm. The resistance value of $R_d$ can be adjusted somewhat, to obtain on the average a correct damping. The interconnection is terminated close to symmetrical. The head+interconnection combination is damped close to ideal if the output capacitance of the write driver circuit is kept sufficiently low.

If we consider the damping more precisely, the input impedance at the emitters of transistors T3 and T4 is seen as $R_o + j\omega L_{in}$, where $L_{in}$ can be derived from the transition frequency $f_T$ of the transistor. The inductance $L_{in}$ can be calculated from $$L_{in} = (R_a + R_b) 2\pi f_T.$$

The effect of $L_{in}$ is possibly a reduced damping during transitions, which results in faster transitions of the output current.

Figure 5:
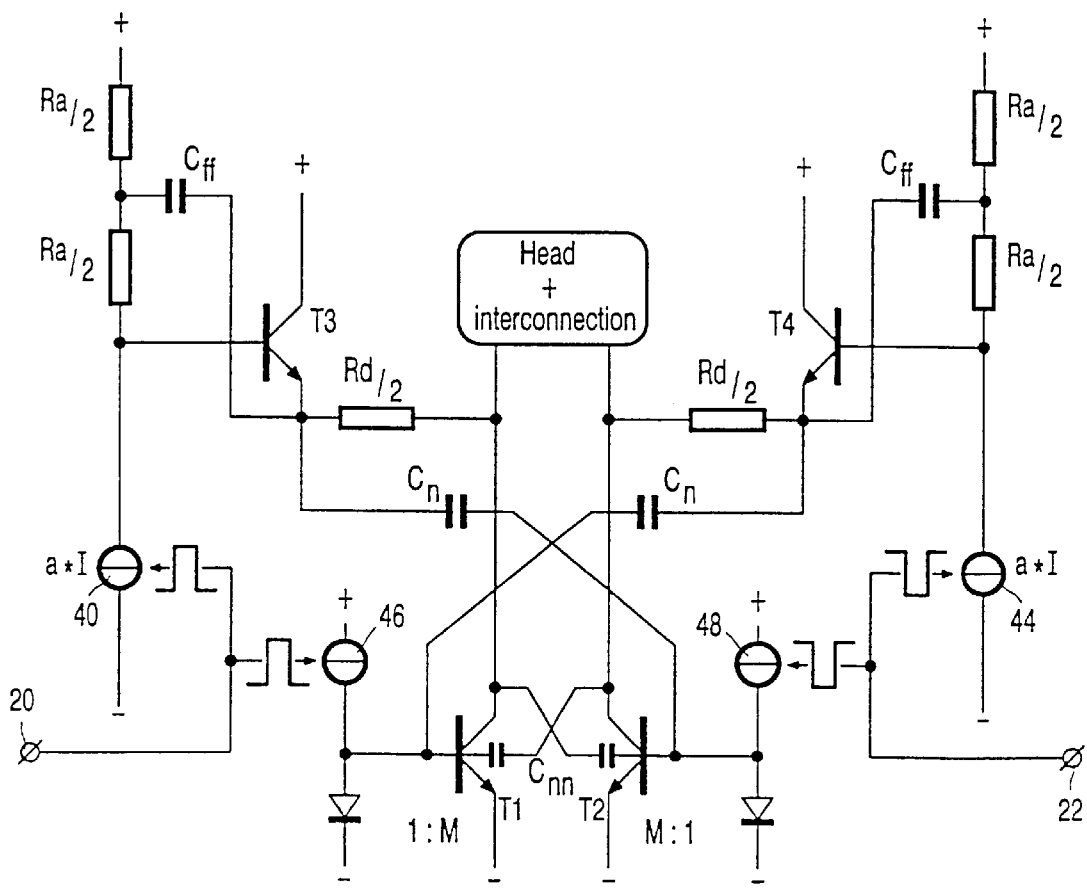
FIG. 5 shows possible compensation capacitors in de circuit construction of FIG. 4
Figure 6:
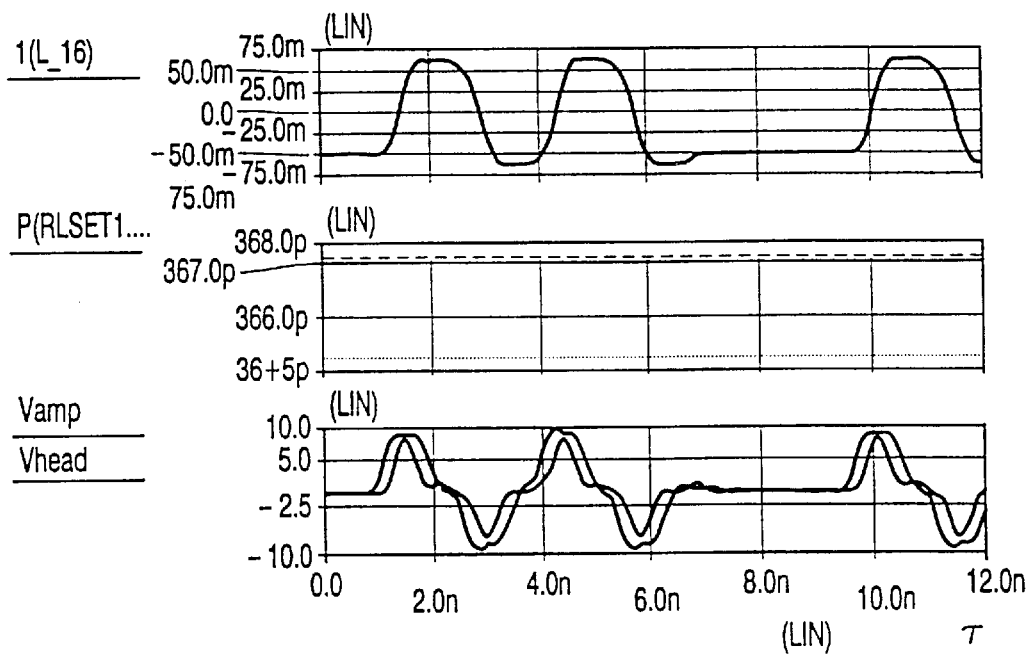
FIG. 6 shows simulation results with the All-NPN write driver.

This circuit construction allows for various compensation capacitors, such as the capacitors Cn, Cnn and Cff, shown in FIG. 5.

Next, it will be described how the factor x for the all NPN write driver can be derived. Consider the write driver circuit shown in FIG. 7. Resistors $R_a$ have been given the value $a.R_d/2$ and are driven from current source transistors T5 and T6. Head and interconnection together have a series resistance $R_s$, for which a typical value is $R_s$=8.5 Ohm. If one wants to design for a certain factor x, one can now calculate the ratio a/n:

$$(1+x).I.a.R_d/2n + x.I.R_d/2 = I.(R+R_d/2).$$

From this equation it can be derived $$a/n = (2.R_s/R_d - x + 1)/(1+x).$$

This formula shows that one needs to design the output driver for a certain 'target' value of $R_s$. Alternatively, this formula can be rewritten to find x for a given a, n, $R_s$ and $R_d$:

$$x = (2.R_s/R_d + 1 - a/n)/(1+a/n).$$

The above formula can be used for evaluation of the output driver. It shows that the output current I depends on the series resistance $R_s$. If the output is short-circuited ($R_s$=0), the output current will be maximum since then factor x is minimum.

Figure 7:
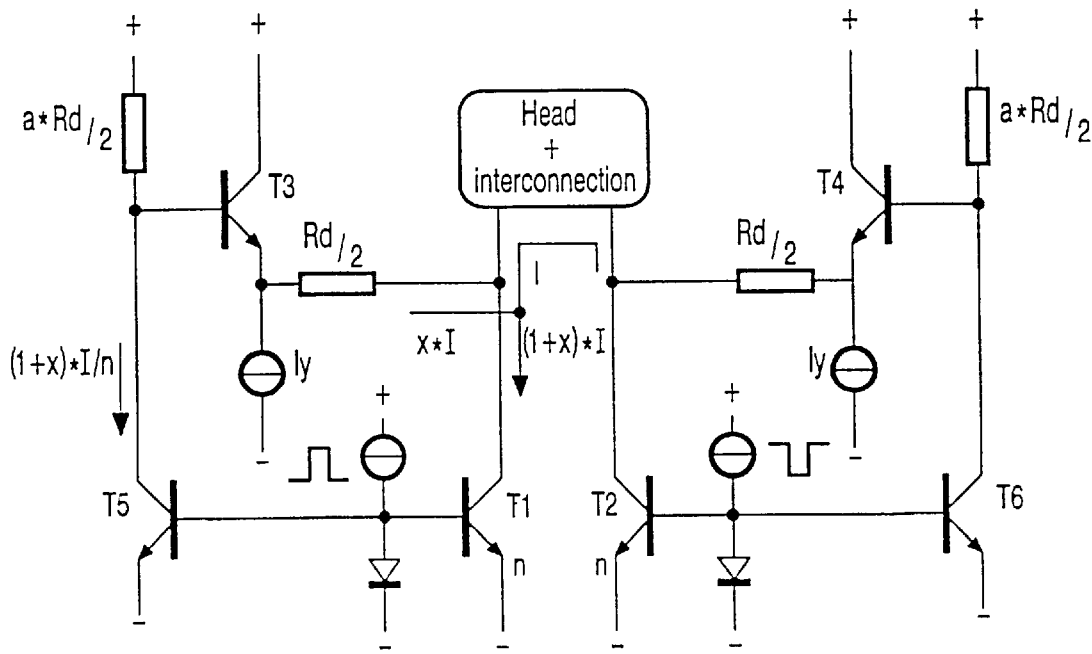
FIG. 7 shows adding currents Iy for more constant and more symmetrical damping.

Current Iy in FIG. 7 has been added to obtain a more constant output impedance, since it prevents transistors T3 and T4 from getting dry. A typical choice would be Iy=I/10.

To be more specific, current Iy brings several advantages:
  The differential mode output impedance is more constant over the steady-state write current range;
  The two single ended output impedances of the write driver are more equal, especially at low steady-state write output currents.

The effect of current Iy is an improved symmetry of the single ended output impedance of the write driver circuit. This is important for minimising the common mode excitation from the write driver.

Figure 8:
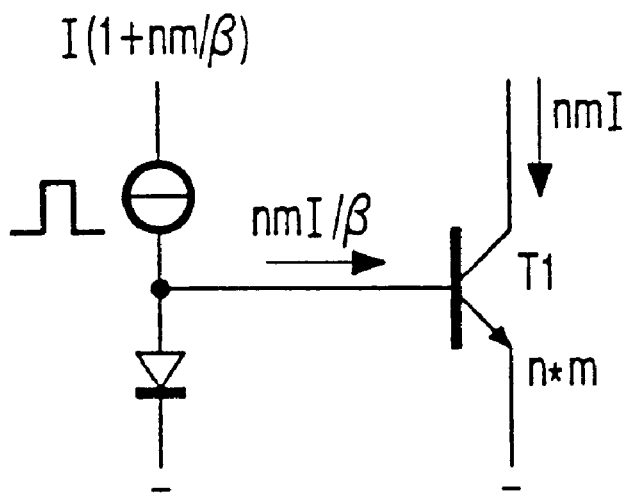
FIG. 8 shows two possible embodiments of the first and second current sources in the write driver circuit.
Figure 8:
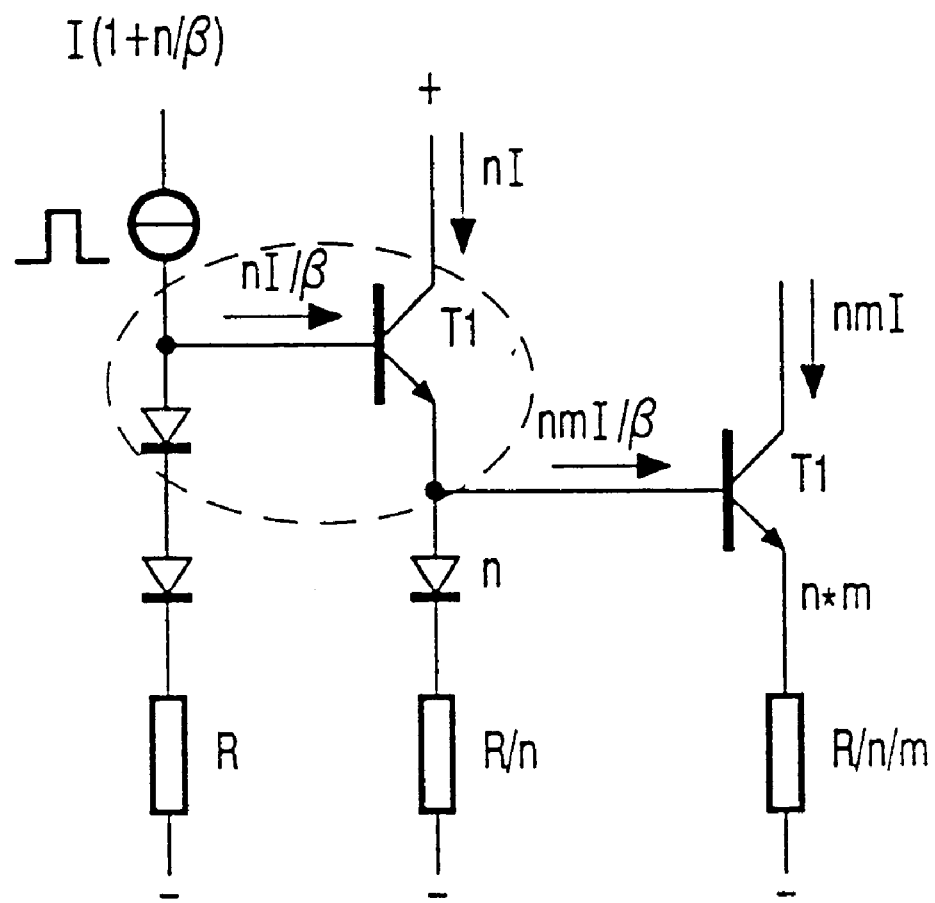

An improved implementation of the current sources 26 and 30 can be used to reduce the output capacitance, see FIG. 8.

The current mirror, which forms part of the output driver, has been indicated so far as a simple non-degenerated mirror. This circuit has reduced output capacitance and improved accuracy over the simple current mirror. In FIG. 8 the accuracy calculation is visualised. With n=m=4 and β=130, the losses reduce from 12% to 3%. These losses vary with varying β (over processing and temperature).

The improved current mirror also eliminates the Miller-effect of the collector-base capacitance of the output npn transistor T1, reducing the current mirror output capacitance from:

$C_{cs} + (nm+1)C_{cb}$ (current mirror shown in FIG. 8, top) to $C_{cs} + C_{cb}$ (current mirror shown in FIG. 8, bottom).

To reduce the input capacitance of the current mirror, the resistor R in FIG. 8 can be swapped with the input diode.

Whilst the invention has been described with reference to preferred embodiments thereof, it is to be understood that these are not limitative examples. Thus, various modifications may become apparent to those skilled in the art, without departing from the scope of the invention, as defined by the claims. Further, any reference signs do not limit the scope of the claims. The invention, as far as incorporated in the write driver apparatus, can be implemented by means of both hardware and software, and several "means" may be represented by the same item of hardware. The word 'comprising' does not exclude the presence of other elements or steps than those listed in a claim. Also, the word "a" or "an" preceding an element does not exclude the presence of a plurality of such elements. In addition, the invention lies in each and every novel feature or combination of features.

What is claimed is:

1. Write driver apparatus for writing an information signal on a magnetic record carrier, comprising:
  a first and a second input terminal (20,22) for receiving the information signal,
  a first point of a first constant potential (+),
  a second point of a second constant potential (−),
  a write head combination (32) having a first and a second input (34,36),
  a first current sink having a first transistor (T3) of a first type, having a first main electrode coupled to the first point of constant potential, having a second main electrode coupled to the first input (34) of the write head combination via a first impedance (38), and a control electrode coupled to the first input terminal (20), a second current sink having a second transistor (T4) of the first type, having a first main electrode coupled to the first point of constant potential, having a second main electrode coupled to the second input (36) of the write head combination via a second impedance (42), and a control electrode coupled to the second input terminal (22), a first current source having a third transistor (T1) of the first type, having a first main electrode coupled to the first input (34) of the write head combination, having a second main electrode coupled to the second point of constant potential, and a control electrode coupled to the first input terminal (20), a second current source having a fourth transistor (T2) of the first type, having a first main electrode coupled to the second input of the write head combination, having a second main electrode coupled to the second point of constant potential, and a control electrode coupled to the second input terminal (22).

2. Write driver apparatus as claimed in claim 1, wherein said first to fourth transistors (T3,T4,T1,T2) are all of the NPN type.

3. Write driver apparatus as claimed in claim 1, wherein the first and second impedances (38,42) are devoid of a feed forward capacitance.

4. Write driver apparatus as claimed in claim 1, wherein with an information signal of a first polarity supplied to the to first and second input terminals (20,22), the first current source is adapted to generate a first current of predetermined amplitude $(1+x).I$, the first current sink is adapted to sink a second current of amplitude substantially equal to $x.I$, where x is a constant smaller than 1, and the second current sink is adapted to sink a third current of amplitude substantially equal to I via the write head combination (32), and wherein with an information signal of a second polarity, opposite said first polarity, supplied to the first and second input terminals (20,22), the second current source is adapted to generate a current substantially equal to $(1+x).I$, the second current sink is adapted to sink a current of amplitude substantially equal to $x.I$, and the first current sink is adapted to sink a current of amplitude substantially equal to I via the write head combination (32).

5. Write driver apparatus as claimed in claim 4, wherein said value of x is at least one order of magnitude smaller than 1.

6. Write driver apparatus as claimed in claim 1, wherein a first capacitor ($C_n$) is coupled between the second main electrode of the first transistor (T3) and the control electrode of the fourth transistor (T2) and a second capacitor ($C_n$) is coupled between the second main electrode of the second transistor (T4) and the control electrode of the third transistor (T1) and that the capacitance values of the first and the second capacitor are substantially equal.

7. Write driver apparatus as claimed in claim 1, wherein a third capacitor ($C_{nn}$) is coupled between the first main electrode of the third transistor (T1) and the control electrode of the fourth transistor (T2) and a fourth capacitor (Cnn) is coupled between the first main electrode of the fourth transistor and the control electrode of the third transistor and that the capacitance values of the third and the fourth capacitor are substantially equal.

8. Write driver apparatus as claimed in claim 1, wherein said first current sink further comprises a third current source ($I_y$) coupled between the second main electrode of the first transistor (T3) and the second point of constant potential (−) and said second current sink comprises a fourth current source ($I_y$) coupled between the second main electrode of the second transistor (T4) and the second point of constant potential (−), both current sources being adapted to generate substantially the same current.

9. Write driver apparatus as claimed in claim 4, wherein said first current sink further comprises a series arrangement of an impedance (50) and a fifth current source (40) coupled between said first and second points of constant potential, the control electrode of said first transistor (T3) being coupled to an electrical point in said series arrangement, between said impedance and said fifth current source, said impedance and fifth current source being dimensioned such that, when a current $(1+x).I$ is generated by said first current source, said first current sink is adapted to sink said current $x.I$.

10. Write driver apparatus as claimed in claim 4, wherein said second current sink further comprises a series arrangement of an impedance (52) and a sixth current source (44) coupled between said first and second points of constant potential, the control electrode of said second transistor (T4) being coupled to an electrical point in said series arrangement, between said impedance and said sixth current source, said impedance and sixth current source being dimensioned such that, when a current $(1+x).I$ is generated by said second current source, said second current sink is adapted to sink said current $x.I$.

11. Hard disk drive provided with the write driver apparatus as claimed in claim 1.

* * * * *